(12) United States Patent
Saboundji et al.

(10) Patent No.: US 11,306,599 B2
(45) Date of Patent: Apr. 19, 2022

(54) TURBINE COMPONENT MADE FROM SUPERALLOY AND ASSOCIATED MANUFACTURING METHOD

(71) Applicant: SAFRAN, Paris (FR)

(72) Inventors: Amar Saboundji, Moissy-Cramayel (FR); Virginie Jaquet, Moissy-Cramayel (FR)

(73) Assignee: SAFRAN, Paris (FR)

( * ) Notice: Subject to any disclaimer, the term of this patent is extended or adjusted under 35 U.S.C. 154(b) by 431 days.

(21) Appl. No.: 16/498,836

(22) PCT Filed: Mar. 30, 2018

(86) PCT No.: PCT/FR2018/050814
§ 371 (c)(1),
(2) Date: Sep. 27, 2019

(87) PCT Pub. No.: WO2018/178603
PCT Pub. Date: Oct. 4, 2018

(65) Prior Publication Data
US 2021/0062660 A1    Mar. 4, 2021

(30) Foreign Application Priority Data
Mar. 30, 2017   (FR) ..................................... 17/00347

(51) Int. Cl.
*F01D 5/28* (2006.01)
*C23C 14/16* (2006.01)
*C23C 28/00* (2006.01)

(52) U.S. Cl.
CPC .............. *F01D 5/288* (2013.01); *C23C 14/16* (2013.01); *C23C 28/321* (2013.01);
(Continued)

(58) Field of Classification Search
None
See application file for complete search history.

(56) References Cited

U.S. PATENT DOCUMENTS 10,358,700 B2 *   7/2019   Yoshizawa ........... B22D 21/005
2004/0229075 A1   11/2004  Gleeson et al.
(Continued)

FOREIGN PATENT DOCUMENTS

| CN | 105951030 A | 9/2016 |
| EP | 1652964 A1 | 5/2006 |
| WO | 2014/143257 A1 | 9/2014 |

OTHER PUBLICATIONS

Xiao-Xia Wu and Chong-Yu Wang, Influence of alloying elements upon the theoretical tensile strength of Ni-based model superalloy: γ-Ni/γ'-Ni3Al multilayer, Computational Materials Science, vol. 119, 2016, pp. 120-129. (Year: 2016).*

(Continued)

*Primary Examiner* — Daniel J. Schleis
(74) *Attorney, Agent, or Firm* — Womble Bond Dickinson (US) LLP

(57) ABSTRACT

The invention concerns a turbine component, such as a turbine blade or a distributor fin, for example, comprising a substrate made from single-crystal nickel superalloy, and a metal sublayer covering the substrate, characterised in that the metal sublayer comprises at least two elementary layers, including a first elementary layer and a second elementary layer, the first elementary layer being arranged between the substrate and the second elementary layer, each elementary layer comprising a γ'-$Ni_3Al$ phase, and optionally a γ-Ni phase, and in that the average atomic fraction of aluminum in the second elementary layer is strictly greater than the average atomic fraction of aluminum in the first elementary layer.

14 Claims, 1 Drawing Sheet

(52) U.S. Cl.
CPC .......... *C23C 28/3455* (2013.01); *C23C 28/36* (2013.01); *F05D 2300/132* (2013.01); *F05D 2300/143* (2013.01); *F05D 2300/175* (2013.01); *F05D 2300/607* (2013.01)

(56) References Cited

U.S. PATENT DOCUMENTS

| | | | | |
|---|---|---|---|---|
| 2006/0093851 | A1* | 5/2006 | Darolia | C23C 28/325 428/680 |
| 2016/0010182 | A1* | 1/2016 | Lee | C23C 16/06 428/680 |

OTHER PUBLICATIONS

International Preliminary Report on Patentability received for PCT Patent Application No. PCT/FR2018/050814, dated Oct. 10, 2019, 14 pages (8 pages of English Translation and 6 pages of Original Document).

International Search Report and Written Opinion received for PCT Patent Application No. PCT/FR2018/050814, dated Jun. 27, 2018, 16 pages (8 pages of English Translation and 8 pages of Original Document).

Preliminary Research Report received for French Application No. 1700347, dated Aug. 9, 2018, 3 pages (1 page of French Translation Cover Sheet and 2 pages of original document).

Second Office Action for Chinese Application No. 201880028309.8 dated Jul. 19, 2021, 10 pages (2 pages of English translation and 8 pages of original Chinese office action).

\* cited by examiner (State of the art)

(State of the art)

TURBINE COMPONENT MADE FROM SUPERALLOY AND ASSOCIATED MANUFACTURING METHOD

FIELD OF THE INVENTION

The invention concerns a turbine component, such as a turbine blade or a nozzle guide vane, for example, used in aeronautics.

STATE OF THE ART

In a turbojet, the exhaust gases generated by the combustion chamber can reach high temperatures, above 1200° C. or even 1600° C. The turbojet components in contact with these exhaust gases, such as turbine blades for example, must therefore be able to maintain their mechanical properties at these high temperatures.

To this end, it is known to fabricate certain components of the turbojet from "superalloy". Superalloys are a family of high-strength metal alloys that can work at temperatures relatively close to their melting points (typically 0.7 to 0.8 times their melting points).

In order to strengthen the thermal resistance of these superalloys and protect them against oxidation and corrosion, it is known to cover them with a coating that acts as a thermal barrier.

FIG. 1 is a diagram of a section of a turbine component 1, for example a turbine blade 6 or a nozzle guide vane. The component 1 includes a single-crystal metallic superalloy substrate 2 covered with a thermal barrier 10.

FIG. 2 is a diagram of a section of a part of the thermal barrier of the turbine component 1, covering a substrate. The thermal barrier comprises a metallic bond coat 3, a protective layer 4 and a thermally insulating layer 9. The metallic bond coat 3 covers the metallic superalloy substrate 2. The metallic bond coat 3 is itself covered with the protective layer 4, formed by oxidation of the metallic bond coat 3. The protective layer 4 protects the superalloy substrate from corrosion and/or oxidation. The thermally insulating layer 9 covers the protective layer 4. The thermally insulating layer can be made of ceramic, for example yttriated zirconia.

The metallic bond coat 3, sometimes simply "bond coat", provides a bond between the surface of the superalloy substrate and the protective layer. There are two main families of metallic bond coats.

The first family of metallic bond coats includes bond coats based on simple nickel-aluminide β-NiAl or on platinum-modified nickel-aluminide β-NiAlPt.

In the case of a simple or platinum-modified nickel-aluminide (β-NiAl or β-NiAlPt) bond coat, the aluminum content (35-45 at %) of the bond coat is sufficient to form exclusively a protective layer of aluminum oxide ($Al_2O_3$) to protect the superalloy substrate from oxidation and corrosion.

However, when the component is subjected to high temperatures, the difference in concentrations of nickel, and especially of aluminum, between the superalloy substrate and the metal bond coat causes nickel to diffuse into the bond coat and aluminum into the superalloy (a phenomenon called "interdiffusion").

In addition, aluminum is also consumed to form the protective aluminum oxide layer.

These phenomena lead to a premature depletion of aluminum from the bond coat, which favours phase transformations in the bond coat (β-NiAl→γ'-$Ni_3$Al, martensitic transformation). These transformations generate cracks in the bond coat and promote flaking of the aluminum oxide layer.

In addition, the diffusion of certain elements of the superalloy, such as titanium, or certain impurities, such as sulphur, leads to a degradation of the adhesion of the aluminum oxide layer.

Finally, interdiffusion can lead to the formation of secondary reaction zones (SRZs) which strongly degrade the mechanical properties (creep, fatigue) of the coated superalloy.

Thus, interdiffusion between the superalloy substrate and the bond coat can have negative consequences on the service life of the superalloy component.

The second family of metallic bond coats includes simple or platinum-modified γ-(Ni)+γ'-($Ni_3$Al) bond coats.

The advantage of these bond coats is to limit the negative consequences of interdiffusion and thus increase the service life of coated superalloys.

Indeed, these bond coats have a chemical composition close to that of superalloys, which allows them to resist interdiffusion phenomena at high temperatures and to limit surface roughening phenomena, called rumpling, that damage the thermal barrier.

Thanks to a chemical composition close to that of superalloys, these bond coats also limit the formation of secondary reaction zones (SRZs).

On the other hand, a disadvantage of these bond coats is their low aluminum content (15 to 20 at %), which does not allow them to form a protective layer of aluminum oxide capable of surviving throughout the lifetime of a turbojet. When the turbine is used, the protective layer 4 may flake and/or be damaged: the bond coat 3 is then oxidized to form a new protective layer 4 or a new part of protective layer 4. The metallic bond coat 3 is an aluminum reservoir for the surface formation of aluminum oxide: when the amount of aluminum available in the metallic bond coat 3 decreases, for example until it is exhausted, and it is no longer possible to form a new protective layer 4. For example, flaking of the protective layer is observed after two hundred hours of use.

Thus, in the end, these types of metallic bond coats can have much lower oxidation and corrosion resistance performance than β-NiAlPt metallic bond coats.

SUMMARY OF THE INVENTION

An aim of the invention is to offer a solution to effectively protect a superalloy turbine component from oxidation and corrosion while offering a longer service life than with known metallic bond coats.

This aim is achieved in the context of the present invention by means of a turbine component comprising:

a nickel-based single-crystal superalloy substrate, and a metallic bond coat covering the substrate, characterized in that the bond coat comprises at least two elemental layers, including a first elemental layer and a second elemental layer, the first elemental layer being disposed between the substrate and the second elemental layer, each elemental layer comprising a γ'-$Ni_3$Al phase and in that the average atomic fraction of aluminum in the second elemental layer is strictly higher than the average atomic fraction of aluminum in the first elemental layer.

Since the metallic bond coat is made up of several elemental layers, it is possible to gradually vary the aluminum concentration from one elemental layer to another, in order to limit interdiffusion between two elemental layers.

In addition, the aluminum concentration of the second elemental layer can be chosen to form a protective aluminum oxide layer with a longer service life than the known metallic bond coats of the second family.

The invention is advantageously complemented by the following features, taken individually or in any of their technically possible combinations:

at least one elemental layer comprises a γ-Ni phase;

the average atomic fraction of aluminum in the first elemental layer is strictly higher than the average atomic fraction of aluminum in the substrate;

the first elemental layer comprises a γ'-Ni$_3$Al phase and a γ-Ni phase, and the metallic bond coat comprises at least one further elemental layer comprising only a γ-Ni phase;

the metallic bond coat comprises a plurality of elemental layers, each elemental layer comprises a γ'-Ni$_3$Al phase, and possibly a γ-Ni phase, and the average atomic fraction of aluminum in the elemental layers increases with distance from the substrate;

the average atomic fraction of aluminum in the elemental layer furthest from the substrate is between 0.22 and 0.35;

the average atomic fraction of aluminum in the elemental layer closest to the substrate is less than 0.2;

the difference between the average atomic fraction of aluminum in the substrate and the average atomic fraction of aluminum in the elemental layer closest to the substrate is less than 0.08;

the difference between the average atomic fraction of aluminum in two successive elemental layers is less than 0.06;

each elemental layer comprises at least one additive selected from chromium and hafnium, and the average atomic fraction of additive in the elemental layers increases with distance from the substrate;

each elemental layer comprises hafnium and the difference between the average atomic fraction of hafnium in two successive elemental layers is less than 0.001;

the average atomic fraction of hafnium in the elemental layer furthest from the substrate is less than 0.03 and the average atomic fraction of hafnium in the elemental layer nearest the substrate is greater than 0.0005.

This goal is also achieved in the context of the present invention through a process for fabricating a turbine component comprising steps of:

deposition of a first elemental layer comprising a γ'-Ni$_3$Al phase, and possibly a γ-Ni phase, and having an average atomic fraction of aluminum $x_1$, on a single-crystal nickel-based metallic superalloy substrate;

deposition of a second elemental layer comprising a γ'-Ni$_3$Al phase, and possibly a γ-Ni phase, and having an average atomic fraction of aluminum $x_2$ strictly greater than $x_1$ on the first elemental layer.

The first elemental layer may have an average atomic fraction of aluminum $x_1$ strictly higher than the average atomic fraction of aluminum $x_0$ in the nickel-based superalloy of the substrate.

PRESENTATION OF THE DRAWINGS

Other features and benefits will also emerge from the following description, which is purely illustrative and not limiting, and should be read in conjunction with the appended figures, among which:

DEFINITIONS

The term "superalloy" refers to a complex alloy with, at high temperature and high pressure, very good resistance to oxidation, to corrosion, to creep and to cyclic stresses (particularly mechanical or thermal). Superalloys have a particular application in the fabrication of components used in aeronautics, such as turbine blades, because they are a family of high-strength alloys that can work at temperatures relatively close to their melting points (typically 0.7 to 0.8 times their melting points).

A superalloy has a two-phase microstructure comprising a first phase (called "γ phase") forming a matrix, and a second phase (called "γ' phase") forming precipitates hardening in the matrix.

The "base" of the superalloy refers to the main metal component of the matrix. In most cases, superalloys include an iron, cobalt, or nickel base, but also sometimes a titanium or aluminum base.

"Nickel-based superalloys" have the advantage of offering a good compromise between oxidation resistance, breaking strength at high temperature and weight, which justifies their use in the hottest parts of turbojets.

Nickel-based superalloys consist of a γ phase (or matrix) of austenite face-centred cubic γ-Ni type, possibly containing additives in a substitutional solid solution α (Co, Cr, W, Mo), and a γ' phase (or precipitate) of type γ'-Ni$_3$X, with X=Al, Ti or Ta. The γ' phase has an L$_{12}$ ordered structure, derived from the face-centred cubic structure, coherent with the matrix, i.e. having an atomic mesh very close to it.

Due to its orderly nature, the γ' phase has the remarkable property of having a mechanical resistance that increases with temperature up to about 800° C. The very strong coherency between the γ and γ' phases confers a very high hot mechanical resistance to nickel-based superalloys, which in turn depends on the γ/γ' ratio and the size of the hardening precipitates.

Nickel-based superalloys generally have a high mechanical resistance up to 700° C., then a mechanical resistance that decreases significantly above 800° C.

The term "atomic fraction" refers to the concentration. All concentrations are expressed in atomic concentration (at %).

DETAILED DESCRIPTION OF THE INVENTION

Figure 1:
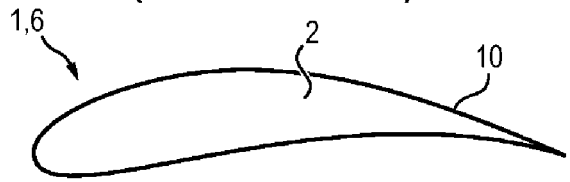
FIG. 1 is a diagram of a section of a turbine component, for example a turbine blade or a nozzle guide vane.
Figure 2:
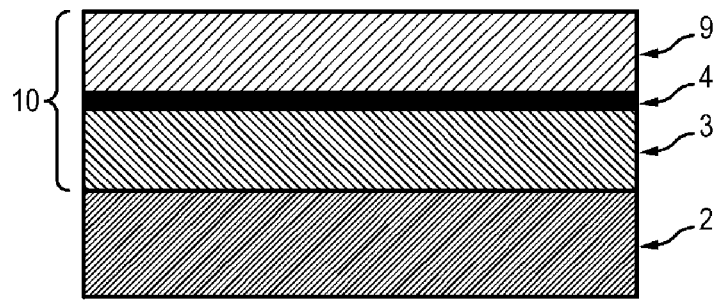
FIG. 2 is a diagram of a section of a part of the thermal barrier of the turbine component.
Figure 3:
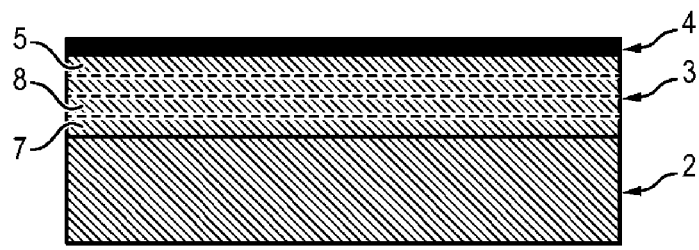
FIG. 3 is a diagram of a substrate 2 covered with a bond coat according to an embodiment of the invention and FIG. 4 is a diagram of a process for fabricating a turbine component 1.

With reference to FIG. 3, a substrate 2 is covered with a thermal barrier.

The elements shown in FIG. 3 may be independently representative of the elements of a turbine blade, a nozzle guide vane, or any other element, part or component of a turbine.

The substrate 2 is made of nickel-based superalloy.

The thermal barrier comprises a metallic bond coat 3, a protective layer 4 and a thermally insulating layer (not shown in FIG. 3).

The substrate 2 is covered by the metallic bond coat 3, which is itself covered by the protective layer 4.

According to one aspect of the invention, the metallic bond coat 3 comprises at least two elemental layers 5. FIG. 3 illustrates an embodiment wherein the bond coat 3 has four elemental layers 5.

In general, the advantage of the interface(s) between the elemental layers 5 is to limit or prevent the diffusion of metal and/or oxygen at high temperature between the elemental layers and thus limit or prevent interdiffusion.

The bond coat 3 comprises in particular a first elemental layer 7 and a second elemental layer 8. The first elemental layer 7 is disposed between the substrate 2 and the second elemental layer 8. In general, the average atomic fraction of aluminum in the second elemental layer 8 is strictly higher than the average atomic fraction of aluminum in the first elemental layer 7.

Thus, an aluminum atomic fraction gradient can be generated in a bond coat 3.

In general, each elemental layer includes a γ'-Ni₃Al phase and possibly a γ-Ni phase.

According to one aspect of the invention, the first elemental layer includes a γ'-Ni₃Al phase and a γ-Ni phase, and another elemental layer includes only a γ-Ni phase. Advantageously, a plurality of elemental layers includes a γ'-Ni₃Al phase and a γ-Ni phase, and a plurality of elemental layers includes only a γ-Ni phase. The average atomic fraction of aluminum in the elemental layers increases with distance from the substrate; in other words, a positive gradient of the aluminum atomic fraction can thus be generated in the bond coat 3 in a direction from the substrate to the protective layer 4.

This feature has two concomitant effects:
- the average atomic fraction of aluminum in the elemental layer 5 furthest from the substrate is sufficient to form exclusively a protective layer 4 of aluminum oxide so as to protect the superalloy substrate 2 from oxidation and corrosion, and
- the average atomic fraction of aluminum in the elemental layer 7 closest to the substrate is sufficiently low to limit the diffusion of aluminum from the elemental layer 7 (i.e. the elemental layer in contact with the substrate 2) to the substrate 2.

The average atomic fraction of aluminum in the elemental layer furthest from the substrate (i.e. the elemental layer that forms the protective layer 4) may be between 0.22 and 0.35 and preferably between 0.25 and 0.3.

Thus, the protective layer formed exclusively of protective aluminum oxide can be formed on the bond coat 3, in order to protect the superalloy against oxidation and corrosion.

The average atomic fraction of aluminum in the elemental layer 5 closest to the substrate may be less than 0.2 and preferably between 0.15 and 0.2. Advantageously, the average atomic fraction of aluminum in the first elemental layer is strictly higher than the average atomic fraction of aluminum in the substrate. The difference between the average atomic fraction of aluminum in the substrate and the average atomic fraction of aluminum in the elemental layer closest to the substrate may also be less than 0.08 and preferentially less than 0.06.

Thus, the diffusion of aluminum to the substrate is limited or even prevented.

According to another aspect of the invention, the difference in the average atomic fraction of aluminum between two successive elemental layers is limited. It can advantageously be less than 0.06. Thus, the diffusion of aluminum between two successive elemental layers can be limited or even prevented. Indeed, the closer the average atomic fraction of aluminum between two elemental layers, the lower the diffusion of aluminum between these two layers.

Table 1 presents the allotropic phase, the atomic fraction of aluminum $x_j$ and the thickness of each j-th elemental layer 5 according to an embodiment of the invention, j being between 1 and m, m being a natural integer designating the total number of elemental layers composing the metallic bond coat 3.

TABLE 1

| | Phase | Average atomic fraction of Al (at %) | Thickness (μm) |
|---|---|---|---|
| m-th elemental layer | γ' | $x_m = x_{m-1} + (2 \text{ to } 4)$ | 1 to 5 |
| ... | ... | ... | ... |
| (n + 2)th elemental layer | γ' | $x_{n+2} = x_{n+1} + (2 \text{ to } 4)$ | 1 to 5 |
| (n + 1)th elemental layer | γ' | $x_{n+1} = x_n + (2 \text{ to } 4)$ | 1 to 5 |
| n-th elemental layer | γ/γ' | $x_n = x_{n-1} + (2 \text{ to } 4)$ | 1 to 5 |
| ... | ... | ... | ... |
| 3rd elemental layer | γ/γ' | $x_3 = x_2 + (2 \text{ to } 4)$ | 1 to 5 |
| 2nd elemental layer | γ/γ' | $x_2 = x_1 + (2 \text{ to } 4)$ | 1 to 5 |
| 1st elemental layer | γ/γ' | $x_1 = x_0 + (2 \text{ to } 4)$ | 1 to 5 |
| Substrate | γ/γ' | $x_0$ | |

Each elemental layer may contain, in addition to nickel Ni and aluminum Al, other chemical elements, or additives, such as chromium Cr and hafnium Hf. In the embodiment corresponding to Table 1, the average atomic fractions of Cr and Hf, not represented, are equal between the different elemental layers. On the other hand, the average atomic fraction of aluminum in an elemental layer increases, i.e. increases as the elemental layer 5 is moved away from the substrate. Conversely, the average atomic fraction of nickel in an elemental layer decreases, i.e. decreases as the elemental layer 5 is moved away from the substrate.

Table 2 shows the allotropic phase, the atomic fraction of aluminum $x_j$ and the thickness of each j-th elemental layer 5 according to an example more particularly adapted to the use of the AM1 superalloy and wherein m=7.

TABLE 2

| | Phase | Average atomic fraction of Al (at %) | Thickness (μm) |
|---|---|---|---|
| 7th elemental layer | γ' | $x_7 = 26 \text{ to } 28$ | 1 to 5 |
| 6th elemental layer | γ' | $x_6 = 24 \text{ to } 26$ | 1 to 5 |
| 5th elemental layer | γ' | $x_5 = 22 \text{ to } 24$ | 1 to 5 |
| 4th elemental layer | γ/γ' | $x_4 = 20 \text{ to } 22$ | 1 to 5 |
| 3rd elemental layer | γ/γ' | $x_3 = 18 \text{ to } 20$ | 1 to 5 |
| 2nd elemental layer | γ/γ' | $x_2 = 16 \text{ to } 18$ | 1 to 5 |
| 1st elemental layer | γ/γ' | $x_1 = 14 \text{ to } 16$ | 1 to 5 |
| AM1 substrate | γ/γ' | $x_0 = 12$ | |

In general, the thickness of each elemental layer is between 100 nm and 20 μm.

According to an embodiment of the invention, an average atomic fraction gradient of chromium and/or of hafnium is generated in the bond coat 3. Each of the elemental layers 5 comprises at least one additive, chosen from chromium and/or hafnium, and the average atomic fraction of chromium and/or of hafnium of each of the elemental layers increases, i.e. increases with distance from the substrate.

Thus, the interdiffusion of chromium and/or of hafnium from one elemental layer 5 to another is limited or even prevented.

According to one aspect of the invention, the difference in the average atomic fraction of hafnium between two consecutive elemental layers is advantageously less than $2 \cdot 10^{-4}$ and preferably less than $10^{-4}$. The average atomic fraction of hafnium in the elemental layer 5 closest to the substrate is advantageously less than $10 \cdot 10^{-4}$, preferentially less than $5 \cdot 10^{-4}$. The average atomic fraction of hafnium in the elemental layer 5 closest to the protective layer 4 is advantageously between 0.005 and 0.03, preferentially between 0.01 and 0.02.

According to an aspect of the invention wherein a chromium gradient is achieved in the bond coat, the difference in the average atomic fraction of chromium between two consecutive elemental layers is advantageously between 0.001 and 0.02, and preferentially between 0.005 and 0.01. The average atomic fraction of chromium in the elemental layer 5 closest to the substrate is advantageously less than 0.07. The average atomic fraction of chromium in the elemental layer 5 closest to the protective layer 4 is advantageously higher than 0.1.

Figure 4:
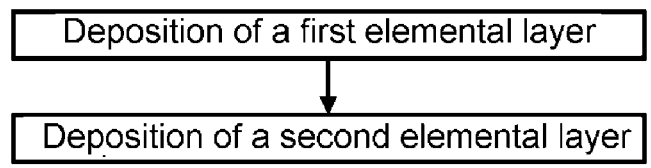

FIG. 4 is a diagram of the steps of a process for fabricating a turbine component 1. Such a process comprises at least two steps:
- a first step consists in depositing a first elemental layer 7 on a single-crystal nickel-based metallic superalloy substrate. The first elemental layer deposited includes a γ'-Ni₃Al phase and possibly a γ-Ni phase. The first layer is deposited with a controlled atomic fraction of aluminum $x_1$. The material of the first elemental layer can be a nickel-based metallic alloy or superalloy. Advantageously, the average aluminum fraction $x_1$ is strictly higher than the average aluminum fraction $x_0$ of the substrate 2;
- a second step consists in depositing a second elemental layer 8 on the first elemental layer 7. The second elemental layer 8 deposited includes a γ'-Ni₃Al phase and possibly a γ-Ni phase. The second elemental layer 8 deposited has an average atomic fraction $x_2$ strictly greater than $x_1$.

The steps are repeated to deposit a number m of elemental layers so that the last elemental layer 5 deposited has a predetermined average atomic fraction. The predetermined average atomic fraction is between 0.22 and 0.35.

The different elemental layers 5 of bond coat 3 can be applied by physical vapor deposition (PVD). Different PVD methods can be used for the fabrication of the elemental layer 5 such as sputtering, joule evaporation, laser ablation and electron beam assisted physical vapor deposition.

Two distinct methods can be used to precisely control the atomic fractions in each element of each of the successive elemental layers 5:
- several material targets can be used sequentially (i.e. one after the other), using a target to deposit an elemental layer. Each target includes a material whose chemical composition is that of a corresponding elemental layer 5;
- several material targets can be used in parallel, simultaneously, during deposition of one or more elemental layers. Each target may, for example, include a particular chemical element.

Each layer can be deposited by co-evaporation or co-pulverization: in this case, the respective evaporation or sputtering rate imposed on each target during deposition of an elemental layer 5 then determines the stoichiometry of the said layer.

The invention claimed is:

1. A turbine component comprising:
   a single-crystal nickel-based superalloy substrate, and
   a metallic bond coat covering the substrate,
   the metallic bond coat comprising at least two elemental layers, including a first elemental layer and a second elemental layer, the first elemental layer being disposed between the substrate and the second elemental layer, each elemental layer comprising a γ'-Ni₃Al phase and in that the average atomic fraction of aluminium in the second elemental layer is strictly higher than the average atomic fraction of aluminium in the first elemental layer.

2. The turbine component of claim 1, wherein at least one elemental layer comprises a γ-Ni phase.

3. The turbine component of claim 1, wherein the average atomic fraction of aluminium in the first elemental layer is strictly higher than the average atomic fraction of aluminium in the substrate.

4. The turbine component of claim 1, wherein the first elemental layer comprises a γ'-Ni₃Al phase and a γ-Ni phase, and the metallic bond coat comprises at least one further elemental layer comprising only a γ-Ni phase.

5. The turbine component of claim 1, wherein the metallic bond coat comprises a plurality of elemental layers, each elemental layer comprising a γ'-Ni₃Al phase, and possibly a γ-Ni phase, and wherein the average atomic fraction of aluminium in the elemental layers increases with distance from the substrate.

6. The turbine component of claim 1, wherein the average atomic fraction of aluminium in the elemental layer furthest from the substrate is between 0.22 and 0.35.

7. The turbine component of claim 1, wherein the average atomic fraction of aluminium in the elemental layer closest to the substrate is less than 0.2.

8. The turbine component of claim 1, wherein the difference between the average atomic fraction of aluminium in the substrate and the average atomic fraction of aluminium in the elemental layer closest to the substrate is less than 0.08.

9. The turbine component of claim 1, wherein the difference between the average atomic fraction of aluminium in two successive elemental layers is less than 0.06.

10. The turbine component of claim 1, wherein each elemental layer comprises at least one additive selected from chromium and hafnium, and wherein the average atomic fraction of additive in the elemental layers increases with distance from the substrate.

11. The turbine component of claim 10, wherein each elemental layer comprises hafnium, and wherein the difference between the average atomic fraction of hafnium in two successive elemental layers is less than 0.001.

12. The turbine component of claim 10, wherein the average atomic fraction of hafnium in the elemental layer furthest from the substrate is less than 0.03 and the average atomic fraction of hafnium in the elemental layer nearest the substrate is greater than 0.0005.

13. Process for fabricating a turbine component comprising steps of:
   a) deposition of a first elemental layer comprising a γ'-Ni₃Al phase, and possibly a γ-Ni phase, and having an average atomic fraction of aluminium $x_1$, on a single-crystal nickel-based metallic superalloy substrate;

b) deposition of a second elemental layer comprising a γ'-Ni$_3$Al phase, and possibly a γ-Ni phase, and having an average atomic fraction of aluminium $x_2$ strictly greater than $x_1$ on the first elemental layer.

14. The process of claim 13, wherein the first elemental layer has an average atomic fraction of aluminium $x_1$ strictly higher than the average atomic fraction of aluminium $x_0$ in the nickel-based superalloy of the substrate.

\* \* \* \* \*